(12) United States Patent
Wu et al.

(10) Patent No.: US 11,824,349 B2
(45) Date of Patent: Nov. 21, 2023

(54) ELECTROSTATIC DISCHARGE PROTECTION CIRCUIT

(71) Applicant: Realtek Semiconductor Corporation, Hsinchu (TW)

(72) Inventors: Han Hsin Wu, Hsinchu (TW); Chung-Yu Huang, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 3 days.

(21) Appl. No.: 17/654,820

(22) Filed: Mar. 15, 2022

(65) Prior Publication Data

US 2023/0138437 A1 May 4, 2023

(30) Foreign Application Priority Data

Nov. 4, 2021 (TW) .................................. 110141084

(51) Int. Cl.
*H02H 9/04* (2006.01)
(52) U.S. Cl.
CPC .................................. *H02H 9/046* (2013.01)
(58) Field of Classification Search
CPC ....................................................... H02H 9/046
USPC .......................................................... 361/56
See application file for complete search history.

(56) References Cited

U.S. PATENT DOCUMENTS

| | | | |
|---|---|---|---|
| 9,048,655 B2* | 6/2015 | Meng | H02H 9/046 |
| 2008/0049365 A1* | 2/2008 | Worley | H01L 27/0285 |
| | | | 361/56 |
| 2013/0182356 A1* | 7/2013 | Yang | H02H 9/046 |
| | | | 361/56 |
| 2013/0265676 A1* | 10/2013 | Prabhu | H02H 9/046 |
| | | | 361/56 |
| 2020/0266187 A1* | 8/2020 | Meng | H01L 27/0285 |
| 2021/0257353 A1* | 8/2021 | Chen | H01L 27/0266 |
| 2023/0009740 A1* | 1/2023 | Hung | H02H 1/0007 |

FOREIGN PATENT DOCUMENTS

| CN | 217641333 U | * 10/2022 | H02H 1/0007 |
|---|---|---|---|
| CN | 115274649 A | * 11/2022 | H01L 27/0285 |

* cited by examiner

*Primary Examiner* — Dharti H Patel
(74) *Attorney, Agent, or Firm* — CKC & Partners Co., LLC

(57) ABSTRACT

An electrostatic discharge (ESD) protection circuit is provided, which includes multiple ESD clamping circuits and a shunt circuit. The multiple clamping circuits comprise multiple transistors, respectively. The multiple transistors are coupled in series between a first power line and a second power line. A shunt circuit is coupled with a first terminal and a control terminal of a first transistor of the multiple transistors. The shunt circuit is configured to conduct the first terminal of the first transistor to the control terminal of the first transistor during a period of an ESD event to raise a voltage of the control terminal of the first transistor. The shunt circuit insulates the first terminal of the first transistor from the control terminal of the first transistor during a period outside the period of the ESD event.

17 Claims, 3 Drawing Sheets

ELECTROSTATIC DISCHARGE PROTECTION CIRCUIT

RELATED APPLICATION

This application claims priority to Taiwan Application Serial Number 110141084, filed Nov. 4, 2021, which is herein incorporated by reference in its entirety.

BACKGROUND

Technical Field

The present disclosure relates to a protection circuit. More particularly, the present disclosure relates to a protection circuit against electrostatic discharge.

Description of Related Art

Electronic devices may accumulate static electricity during the processes of manufacturing, production, storage, and using. The leakage of accumulated electrostatic charges through the path in the electronic device is known as an electrostatic discharge (ESD) event. The ESD events may cause permanent damage to the components in the electronic devices, so current chips are usually provided with an ESD protection circuit that is coupled between a power line and a ground line. During the period of the ESD event, the ESD protection circuit forms a discharge path between the power line and the ground line to bypass the ESD current, thereby preventing the ESD current from flowing into and damaging the chip.

SUMMARY

The disclosure provides an electrostatic discharge (ESD) protection circuit, which includes multiple ESD clamping circuits and a shunt circuit. The multiple clamping circuits comprise multiple transistors, respectively. The multiple transistors are coupled in series between a first power line and a second power line. A shunt circuit is coupled with a first terminal and a control terminal of a first transistor of the multiple transistors. The shunt circuit is configured to conduct the first terminal of the first transistor to the control terminal of the first transistor during a period of an ESD event to raise a voltage of the control terminal of the first transistor. The shunt circuit insulates the first terminal of the first transistor from the control terminal of the first transistor during a period outside the period of the ESD event.

One advantage of the above ESD protection circuit is that the ESD protection circuit is applicable to an advanced manufacturing process having relatively lower voltage endurance.

Another advantage of the above ESD protection circuit is that the ESD protection circuit has an ensured discharging capability to the ESD currents.

It is to be understood that both the foregoing general description and the following detailed description are by examples, and are intended to provide further explanation of the invention as claimed.

DETAILED DESCRIPTION

Figure 1:
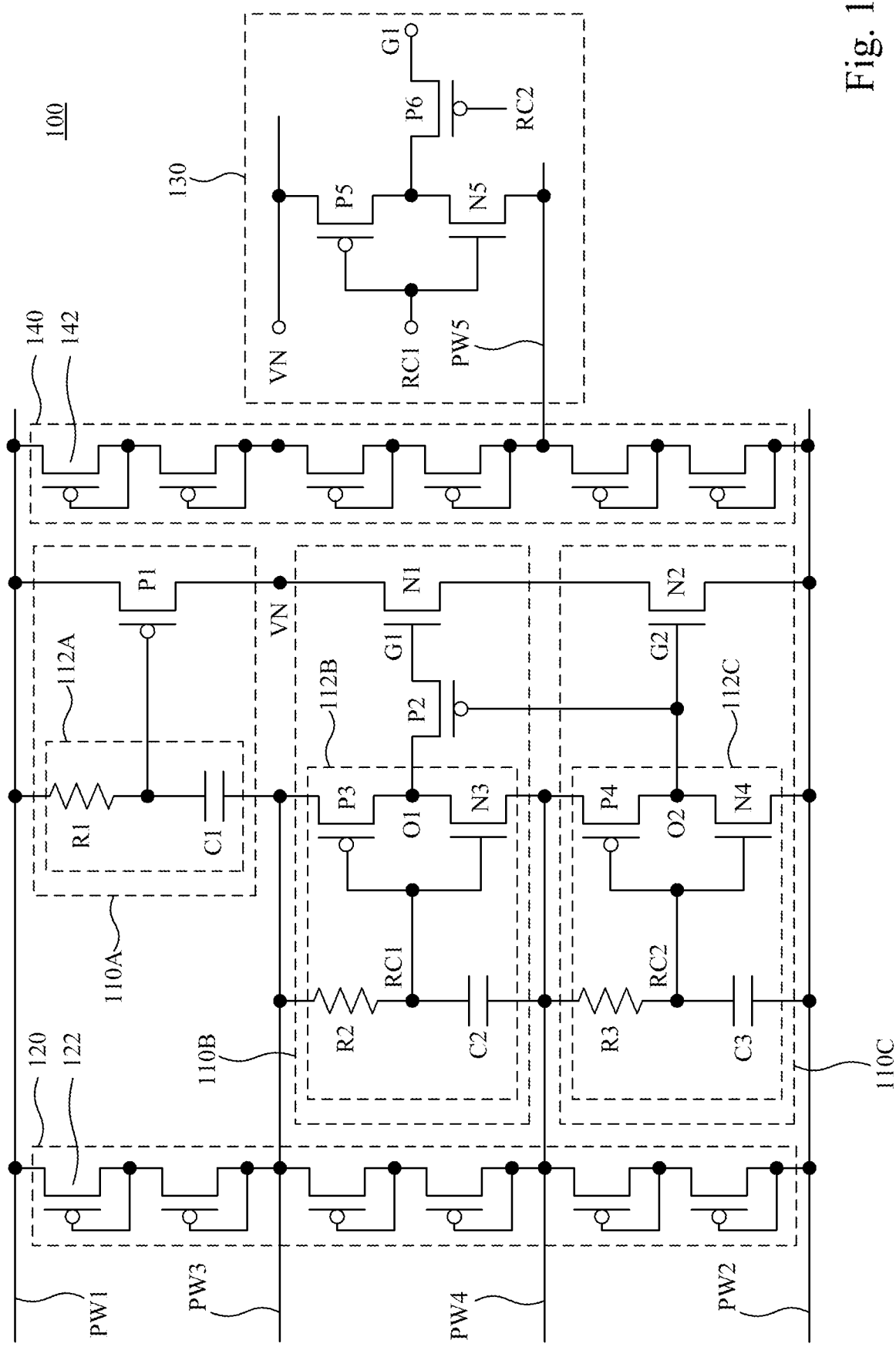
FIG. 1 is a schematic diagram of an electrostatic discharge (ESD) protection circuit according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram of an ESD protection circuit 100 according to one embodiment of the present disclosure. The ESD protection circuit 100 is coupled between the power line PW1 and power line PW2. The ESD protection circuit 100 is configured to form a short circuit between the power line PW1 and power line PW2 during the ESD event so that a discharge path is provided to the ESD current between the power line PW1 and the power line PW2. In some embodiments, the power line PW1, the power line PW2 and ESD protection circuit 100 are peripheral circuits of a chip (not shown), and the power line PW1 and the power line PW2 are respectively configured to provide an operation voltage (e.g., 5V) and a ground voltage to an internal circuit of the chip. Therefore, the ESD protection circuit 100 is able to protect the electronic components (not shown) in the chip coupled between the power line PW1 and the power line PW2 when the ESD event occurs. The ESD protection circuit 100 includes a plurality of ESD clamping circuits 110A-110C, a bias circuit 120, a shunt circuit 130, and a bias circuit 140. The structure and operation of the ESD clamping circuits 110A-110C and the bias circuit 120 are described below.

Structurally, the ESD clamping circuits 110A-110C respectively include a transistor P1, a transistor N1, and a transistor N2, in which the transistor P1, the transistor N1 and the transistor N2 are coupled in series between the power line PW1 and the power line PW2 in this order. In detail, a first terminal of the transistor P1 and a second terminal of the transistor P1 are coupled with the power line PW1 and a node VN, respectively. A first terminal of the transistor N1 and a second terminal of the transistor N1 are coupled with the node VN and a first terminal of the transistor N2, respectively. A second terminal of the transistor N2 is coupled with the power line PW2.

The ESD clamping circuit 110A further includes a driving circuit 112A. The driving circuit 112A includes a resistor R1 and a capacitor C1, in which the resistor R1 is coupled between the power line PW1 and a control terminal of the transistor P1. And the capacitor C1 is coupled between the control terminal of the transistor P1 and a power line PW3. In other words, the driving circuit 112A is configured to control the transistor P1 according to the voltage of the power line PW1 and the voltage of the power line PW3.

The ESD clamping circuit 110B further includes a driving circuit 112B and a transistor P2, in which the driving circuit 112B includes a resistor R2, a capacitor C2, and a transistor P3 and a transistor N3 that form an inverter. The resistor R2 is coupled between the power line PW3 and a node RC1. The capacitor C2 is coupled between the node RC1 and a power line PW4. A first terminal of the transistor P3 and a second terminal of the transistor P3 are coupled with the power line PW3 and a node O1, respectively. A first terminal of the transistor N3 and a second terminal of the transistor N3 are coupled with the node O1 and the power line PW4, respectively, and a control terminal of the transistor P3 and a control terminal of the transistor N3 are coupled with the node RC1. The node O1 may be regarded as the output node of the inverter composed of the transistor P3 and the transistor N3. The first terminal of the transistor P2, the second terminal of the transistor P2 and the control terminal of the transistor P2 are coupled with a control terminal of the transistor N1 (hereinafter referred to as a node G1), the node O1 and a control terminal of the transistor N2 (hereinafter referred to as a node G2), respectively. In other words, the driving circuit 112B is configured to control the transistor N1 according to the voltage of the power line PW3 and the voltage of the power line PW4.

The ESD clamping circuit 110C further includes a driving circuit 112C. The driving circuit 112C includes a resistor R3, a capacitor C3, and a transistor P4 and a transistor N4 that form an inverter. The resistor R3 is coupled between the power line PW4 and a node RC2. The capacitor C3 is coupled between the node RC2 and the power line PW2. A first terminal of the transistor P4 and a second terminal of the transistor P4 are coupled with the power line PW4 and a node O2, respectively. A first terminal of the transistor N4 and a second terminal of the transistor N4 are coupled with the node O2 and the power line PW2, respectively, and a control terminal of the transistor P4 and a control terminal of the transistor N4 are coupled with the node RC2. The node O2 may be regarded as the output node of the inverter composed of the transistor P4 and the transistor N4. In other words, the driving circuit 112C is configured to control the transistor N2 according to the voltage of the power line PW2 and the voltage of the power line PW4.

The bias circuit 120 is configured to divide a voltage between the first power line PW1 and the second power line PW2 to provide at least one reference voltage (e.g., the voltage of the power line PW3 or the voltage of the power line PW4) to each of the ESD clamping circuits 110A-110C. As mentioned above, the ESD clamping circuits 110A-110C control the transistor P1, the transistor N1, and the transistor N2, respectively, by using these reference voltages.

In detail, the bias circuit 120 includes a plurality of diode-connected transistors 122 coupled in series between the power line PW1 and the power line PW2. Part of the diode-connected transistors 122 are coupled in series between the power line PW1 and the power line PW3, another part of the diode-connected transistors 122 are coupled in series between the power line PW3 and the power line PW4, and the other of the multiple diode-connected transistors 122 are coupled in series between the power line PW4 and the power line PW2. Therefore, the voltage of the power line PW1 is greater than the voltage of the power line PW3, the voltage of the power line PW3 is greater than the voltage of the power line PW4, and the voltage of the power line PW4 is greater than the voltage of the power line PW2. In some embodiments, the voltages of the power lines PW1, PW3, PW4, and PW2 are 5 V, 3.3 V, 1.8 V, and 0 V, respectively, but this disclosure is not limited thereto. The number of the diode-connected transistors 122 of the bias circuit 120 coupled between any two of the power lines PW1-PW4 is only an exemplary embodiment, and in some embodiments can be adjusted according to actual requirements. In some embodiments, the bias circuit 120 includes a plurality of diodes, a plurality of resistors, a plurality of diode-connected transistors 122 or any combination of the above that are coupled in series between the power line PW1 and the power line PW2.

Outside the period of an ESD event (i.e., under a normal operating condition), the output voltages from the inverters of the ESD clamping circuits 110A-110C can switch off the transistor P1, the transistor N1 and the transistor N2 (transistor P2 is in a conducting state), and thereby maintaining the power line PW1 and the power line PW2 insulated from each other. In this situation, the output voltages from the inverters of the ESD clamping circuits 110A-110C are around 3.3 V, 1.8 V, and 0 V, respectively, in some embodiments.

On the other hand, during the period of the ESD event, the ESD surge raises the voltage of the power line PW1, the voltage of the power line PW3 and the voltage of the power line PW4. Therefore, the ESD clamping circuits 110A-110C conduct the transistor P1, the transistor N1 and the transistor N2 to drain the ESD current to the power line PW2. In some embodiments, the negative ESD current can flow from the power line PW2 to the power line PW1 through a P-type substrate and an N-type well (not shown) of the transistor P1.

The structure and operation of the shunt circuit 130 and the bias circuit 140 are described below. Structurally, the shunt circuit 130 includes a transistor P5 and a transistor N5 that composes the inverter, and includes a transistor P6. An input terminal, an output terminal, a positive power terminal and a negative power terminal of the inverter composed of the transistor P5 and the transistor N5 are coupled with the node RC1, a first terminal of the transistor P6, the node VN and a power line PW5, respectively. A second terminal and a control terminal of the transistor P6 are coupled with the node G1 and the node RC2, respectively.

The bias circuit 140 includes a plurality of diode-connected transistors 142 coupled in series between the power line PW1 and the power line PW2. In detail, some of the diode-connected transistors 142 are coupled between the power line PW1 and the power line PW5, and the others are coupled between the power line PW5 and the power line PW2. In some embodiments, a voltage (e.g., 1.8 V) of the power line PW5 is close to the voltage of the power line PW4. The number of the diode-connected transistors 142 of the bias circuit 140 between the power line PW1 and the power line PW2 is only an exemplary embodiment, and in some embodiments can be adjusted according to actual requirements. In some embodiments, the bias circuit 140 can include a plurality of diodes, a plurality of resistors, a plurality of diode-connected transistors 142 or any combination of the above that are coupled in series between the power line PW1 and the power line PW2.

Outside the period of the ESD event (i.e., under the normal operating condition), the transistor P5 and the transistor P6 are kept being switched off so that the first terminal (i.e., the node VN) and the control terminal (i.e., the node G1) of the transistor N1 are set to be insulated from each other. On the other hand, during the ESD event, part of the ESD current will be transmitted to the node G1 through the node VN, the transistor P5, and the transistor P6, and can be further transmitted from the node G1 to the node G2 through the transistor P2, the transistor N3, the power line PW4 and the transistor P4.

In other words, during the period of the ESD event the shunt circuit 130 raises the voltages of the nodes G1 and G2 to increase the conduction degree of the transistor N1 and the transistor N2, so as to ensure the discharging capacity to the ESD current of the serial structure of the transistor P1, the transistor N1, and the transistor N2. In addition, the transistor P2 is switched from the switched-on state to the switched-off state after the voltages of the nodes G1 and G2 are raised, so as to prevent the voltage of the node G1 from being pulled down by the transistor N3. In some embodiments that the transistor N1 is easier to be conducted due to manufacturing process factors, the transistor P2 can be omitted, that is, the node O1 can be directly coupled to the node G1.

As can be appreciated from the above, besides the reliable ESD protection capability, the source-drain voltage, the gate-drain voltage, and the gate-source voltage of each transistor in the ESD protection circuit 100 are at lower levels (e.g., none of them exceed 1.8 V) due to the series structure including the transistor P1, the transistor N1 and the transistor N2 and due to the appropriate voltages provided by the power line PW3 and the power line PW4, so that the ESD protection circuit 100 is applicable to an advanced manufacturing process of lower voltage endurance.

Figure 2:
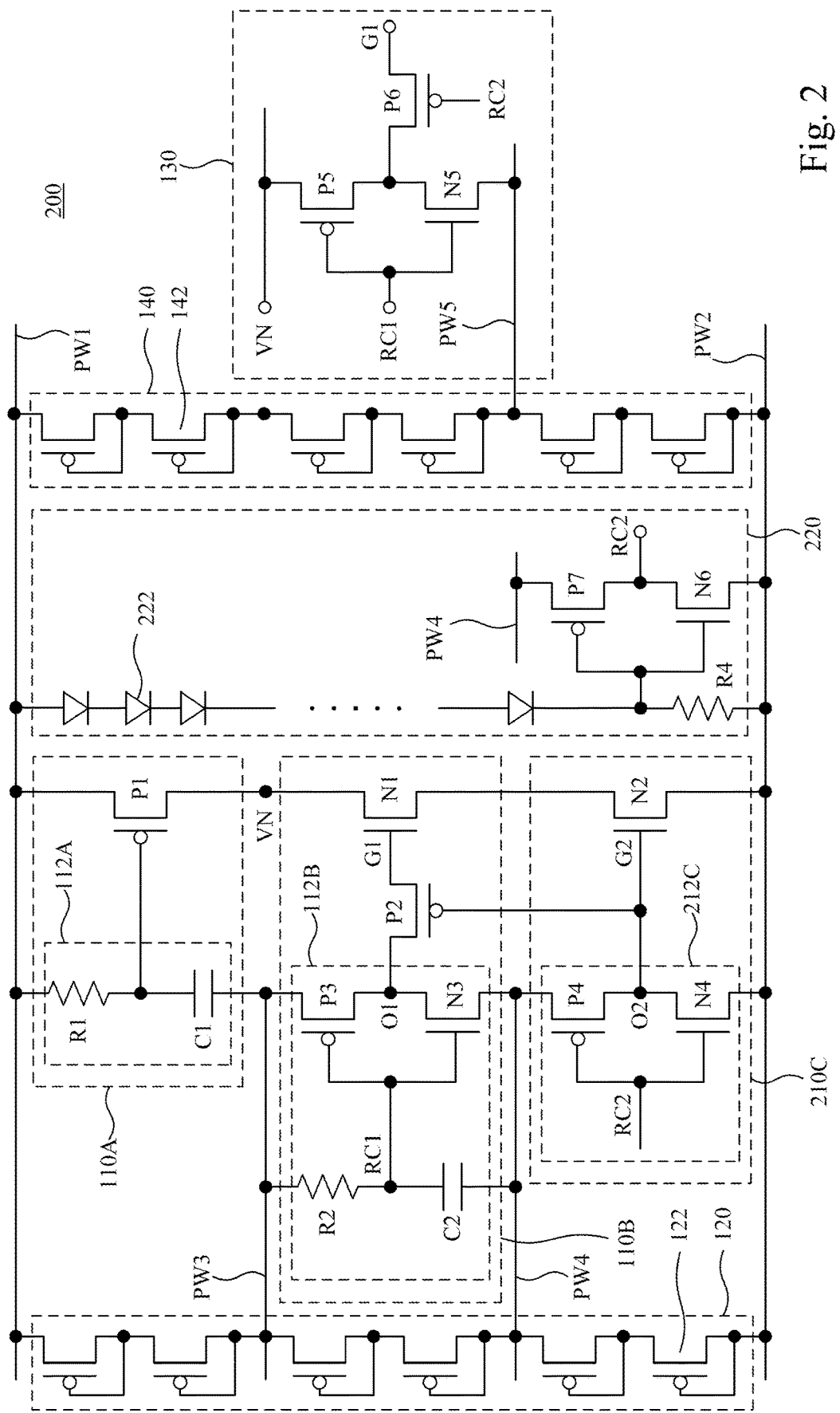
FIG. 2 is a schematic diagram of an ESD protection circuit according to one embodiment of the present disclosure.

FIG. 2 is a schematic diagram of an ESD protection circuit 200 according to one embodiment of the present disclosure. The ESD protection circuit 200 in FIG. 2 is similar to the ESD protection circuit 100 in FIG. 1, so the following only explains the differences in detail. The ESD protection circuit 200 replaces the ESD clamping circuit 110C in FIG. 1 by an ESD clamping circuit 210C, and includes an ESD detection circuit 220 configured to drive the ESD clamping circuit 210C.

Structurally, the ESD clamping circuit 210C includes a transistor N2 and a driving circuit 212C, in which the driving circuit 212C includes a transistor P4 and a transistor N4 that compose an inverter. Control terminals of the transistor P4 and the transistor N4 are coupled with the ESD detection circuit 220 by the node RC2. The ESD detection circuit 220 includes a transistor P7 and a transistor N6 composing an inverter, a plurality of diodes 222, and a resistor R4. The plurality of diodes 222 are coupled in series between the power line PW1 and the control terminals of the transistor P7 and the transistor N6. The resistor R4 is coupled between the power line PW2 and the control terminals of the transistor P7 and the transistor N6. A first terminal of the transistor P7 and a second terminal of the transistor P7 are coupled with the power line PW4 and the node RC2, respectively. A first terminal of the transistor N6 and a second terminal of the transistor N6 are coupled with the node RC2 and the power line PW2, respectively. In other words, the plurality of diodes 222 and the resistor R4 form a bias circuit, and this bias circuit is configured to set the voltage of an input terminal of the inverter composed of the transistor P7 and the transistor N6. In some embodiments, the plurality of diodes 222 and the resistor R4 can be replaced by a plurality of diode-connected transistors, a plurality of resistors, a plurality of diodes, or any combination of the above that are coupled in series.

In operation, the ESD detection circuit 220 is configured to compare the voltage of the power line PW1 with a voltage threshold value (e.g., 7 V). If the voltage of the power line PW1 is greater than the voltage threshold value, the ESD detection circuit 220 controls the ESD clamping circuit 210C to conduct the transistor N2. On the contrary, if the voltage of the power line PW1 is lower than or equal to the voltage threshold value, the ESD detection circuit 220 controls the ESD clamping circuit 210C to switch off the transistor N2.

In detail, the voltage threshold value can be determined by the number of diodes 222 coupled in series and the resistance of the resistor R4. When a surge voltage higher than the voltage threshold value occurs on the power line PW1 during the period of the ESD event, the inverter formed by the transistor P7 and the transistor N6 outputs a voltage equivalent to logic 0 to the node RC2, so that the voltage of the node G2 is equivalent to logic 1 to conduct the transistor N2. On the other hand, outside the period of the ESD event period, as long as the voltage of the power line PW1 is lower than or equal to the voltage threshold value, the inverter formed by the transistor P7 and the transistor N6 outputs a voltage equivalent to logic 1 to the node RC2, so that the voltage of the node G2 is equivalent to logic 0 to switch off the transistor N2.

By the above operation, the ESD protection circuit 200 of FIG. 2 is capable of preventing the internal circuit of the chip to be protected (not shown) from burning out or malfunctioning when a hot plug event occurs. In detail, although the power line PW1 generates a surge voltage in both the period of the ESD event and a period of the hot plug event, by designing an appropriate voltage threshold value, the ESD protection circuit 200 is capable of distinguishing between the ESD event and the hot plug event. Therefore, the ESD protection circuit 200 would not mistakenly short the internal circuit of the chip to the power line PW2 (e.g., the ground line) due to the hot plug event, so as to avoid the internal circuit of the chip from burning. In addition, the ESD protection circuit 200 would not mistakenly short the power line PW1 to the power line PW2 due to the hot plug event, so that the voltage change of the power line PW1 due to the hot plug event can be transmitted to the internal circuit of the chip, ensuring that the internal circuit of the chip is capable of detecting the hot plug event correctly.

In some embodiments, the bias circuit 120 of the FIG. 2 can be omitted and other peripheral circuits of the chip may provide voltages to the power line PW3 and the power line PW4. In other embodiments, the bias circuit 140 in FIG. 2 can be omitted, and other peripheral circuits of the chip may provide a voltage to the power line PW5.

In the various above-mentioned embodiments, the transistors P1-P6 in FIG. 1 and FIG. 2 can be implemented by P-type transistors, and the transistors N1-N5 can be implemented by N-type transistors, but the present disclosure is not limited thereto. In some embodiments, the doping type of each of the transistor P1, the transistor N1, and the transistor N2 can be determined according to actual design requirements, and the circuit structures of the driving circuits 112A-112C can be correspondingly adjusted. For example, in an embodiment that the N-type transistor N1 is replaced by a P-type transistor, the inverter in the driving circuit 112B can be omitted. In an embodiment that the N-type transistor N2 is replaced by a P-type transistor, the inverter in the driving circuit 112C or the driving circuit 212C can be omitted. In an embodiment that the P-type transistor P1 is replaced by an N-type transistor, an inverter can be added to the driving circuit 112A. The following is a detailed description of an embodiment implemented the P-type transistor P1 is replaced to an N-type transistor in FIG. 3.

Figure 3:
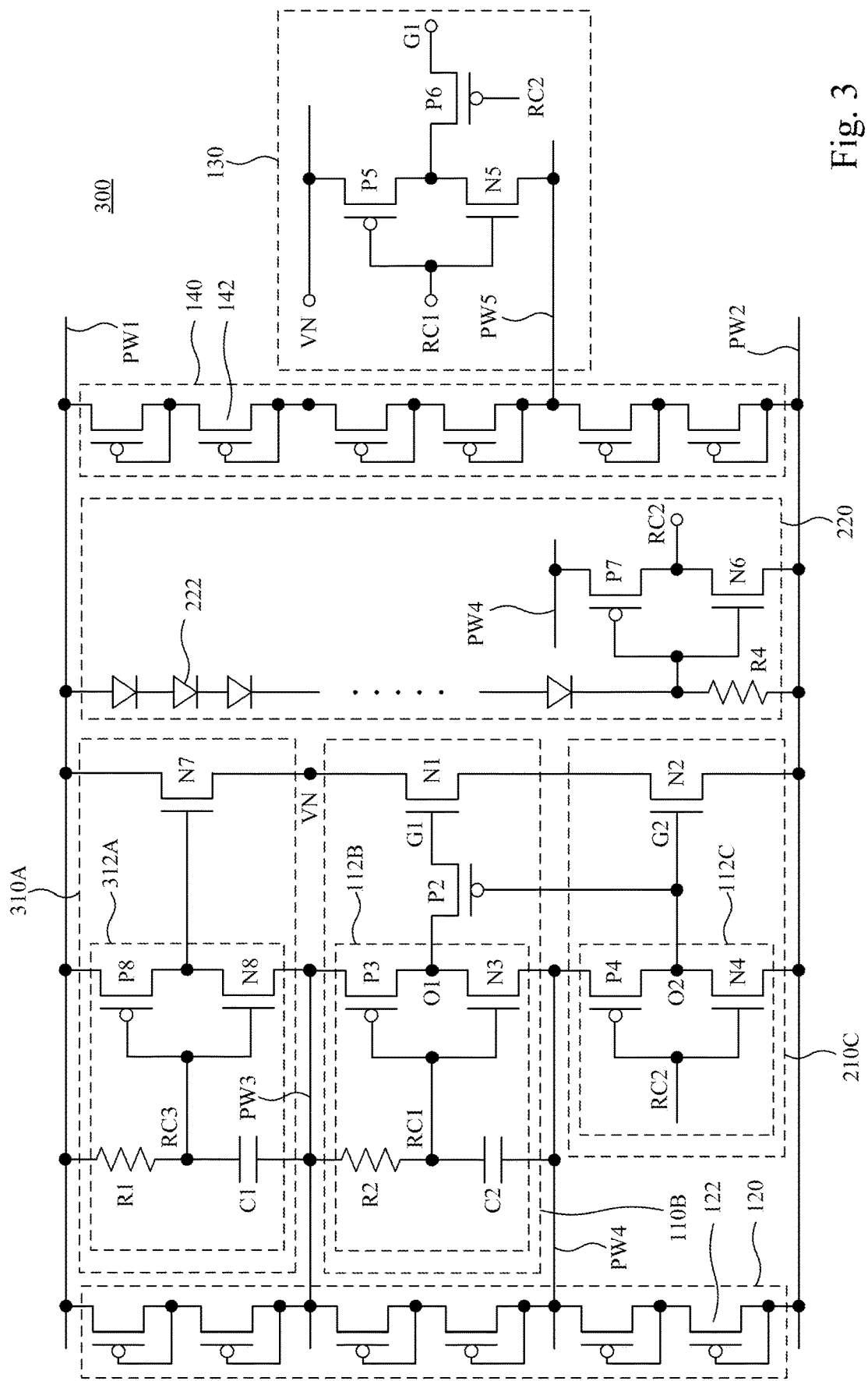
FIG. 3 is a schematic diagram of an ESD protection circuit according to one embodiment of the present disclosure.

FIG. 3 is a schematic diagram of an ESD protection circuit 300 according to one embodiment of the present disclosure. The ESD protection circuit 300 in FIG. 3 is similar to the ESD protection circuit 200 in FIG. 2, so the following only explains the differences in detail. The ESD protection circuit 300 replaces the ESD clamping circuit 110A in FIG. 2 by an ESD clamping circuit 310A, in which the ESD clamping circuit 310A includes an N-type transistor N7 and a driving circuit 312A. The transistor N7 is coupled between the power line PW1 and the node VN. The driving circuit 312A includes a resistor R1, a capacitor C1, and a transistor P8 and a transistor N8 that form an inverter. The resistor R1 is coupled between the power line PW1 and the node RC3. The capacitor C1 is coupled between the node RC3 and the power line PW3. An input terminal, an output terminal, a positive power terminal and a negative power terminal of the inverter composed of the transistor P8 and the transistor N8 are coupled with the node RC3, a control terminal of the transistor N7, the power line PW1 and the power line PW3, respectively. The components and the connection relationship of the ESD clamping circuit 310A in FIG. 3 are also applicable to the embodiment of FIG. 1. That is, the ESD clamping circuit 110A in FIG. 1 may be replaced by the ESD clamping circuit 310A in FIG. 3. For the sake of brevity, those descriptions are omitted.

To sum up, the ESD protection circuits 100-300 effectively reduce the voltage differences between the terminals of the transistors, through the series structure of the transistors (e.g., the series structure of the transistor P1, the transistor N1 and the transistor N2) and the power lines PW1-PW4 having the voltages in a descending order, so that the ESD protection circuits 100-300 are applicable to an advanced process having relatively lower voltage endurance. In addition, through the operation of the shunt circuit 130, the ESD protection circuits 100-300 solve the problem that the series structure of the transistors may have a poor discharge capacity to the ESD current. Moreover, through the operation of the ESD detection circuit 220, the ESD protection circuits 100-300 also can prevent the internal circuit of the chip from burning out when a hot plug event occurs.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. An electrostatic discharge (ESD) protection circuit, comprising:
   a plurality of ESD clamping circuits, comprising a plurality of transistors, respectively, wherein the plurality of transistors are coupled in series between a first power line and a second power line; and
   a shunt circuit, coupled with a first terminal and a control terminal of a first transistor of the plurality of transistors, configured to conduct the first terminal of the first transistor to the control terminal of the first transistor during a period of an ESD event to raise a voltage of the control terminal of the first transistor,
   wherein the shunt circuit insulates the first terminal of the first transistor from the control terminal of the first transistor during a period outside the period of the ESD event.

2. The ESD protection circuit of claim 1, further comprising:
   a first bias circuit, coupled between the first power line and the second power line, configured to divide a voltage between the first power line and the second power line to provide at least one reference voltage to each of the plurality of ESD clamping circuits, wherein each of the plurality of ESD clamping circuits is configured to control a corresponding one of the plurality of transistors according to the at least one reference voltage.

3. The ESD protection circuit of claim 2, wherein the first bias circuit comprises a plurality of diodes coupled in series, a plurality of resistors coupled in series or a plurality of diode-connected transistors coupled in series.

4. The ESD protection circuit of claim 1, wherein the shunt circuit comprises:
   an inverter, comprising a positive power terminal, wherein the positive power terminal is coupled with the first terminal of the first transistor; and
   a shunt transistor, coupled between an output terminal of the inverter and the control terminal of the first transistor, wherein the shunt transistor is conducted during the period of the ESD event, and is switched off during the period outside the period of the ESD event.

5. The ESD protection circuit of claim 4, further comprising:
   a second bias circuit, coupled between the first power line and the second power line, configured to divide a voltage between the first power line and the second power line to set a voltage of a negative power terminal of the inverter.

6. The ESD protection circuit of claim 5, wherein the second bias circuit comprises a plurality of diodes coupled in series, a plurality of resistors coupled in series or a plurality of diode-connected transistors coupled in series.

7. The ESD protection circuit of claim 4, further comprising:
   an ESD detection circuit, coupled with the plurality of ESD clamping circuits and the shunt circuit, and coupled between the first power line and the second power line, configured to compare a voltage of the first power line with a voltage threshold value,
   wherein if the voltage of the first power line is greater than the voltage threshold value, the ESD detection circuit controls the shunt circuit to conduct the shunt transistor, and controls the plurality of ESD clamping circuits to conduct a corresponding one of the plurality of transistors coupled with the second power line, and
   if the voltage of the first power line is lower than or equal to the voltage threshold value, the ESD detection circuit controls the shunt circuit to switch off the shunt transistor, and controls the plurality of ESD clamping circuits to switch off the corresponding one of the plurality of transistors coupled with the second power line.

8. The ESD protection circuit of claim 1, wherein the plurality of ESD clamping circuits comprises:
   a first ESD clamping circuit, comprising the first transistor and a first driving circuit, wherein the first driving circuit is coupled with the control terminal of the first driving circuit, and configured to control the first transistor according to a voltage of the first power line and a voltage of a third power line;

a second ESD clamping circuit, comprising a second transistor of the plurality of transistors coupled with the first power line and comprising a second driving circuit, wherein the second driving circuit is coupled with a control terminal of the second transistor, and configured to control the second transistor according to the voltage of the third power line and a voltage of a fourth power line; and a third ESD clamping circuit, comprising a third transistor of the plurality of transistors coupled with the second power line and comprising a third driving circuit, wherein the third driving circuit is coupled with a control terminal of the third transistor, and configured to control the third transistor according to a voltage of the second power line and the voltage of the fourth power line.

9. The ESD protection circuit of claim 8, wherein, during the ESD event, when the shunt circuit conducts the first terminal of the first transistor to the control terminal of the first transistor to raise a voltage of the control terminal, the control terminal of the first transistor is conducted to the control terminal of the third transistor through the first driving circuit, the fourth power line and the third driving circuit.

10. The ESD protection circuit of claim 8, wherein the first ESD clamping circuit further comprising:

a fourth transistor, coupled between the control terminal of the first transistor and the first driving circuit, wherein a control terminal of the fourth transistor is coupled with the control terminal of the third transistor, wherein the fourth transistor is conducted during the period of the ESD event and switched off during the period outside the period of the ESD event.

11. The ESD protection circuit of claim 8, wherein the voltage of the first power line is greater than the voltage of the third power line, the voltage of the third power line is greater than the voltage of the fourth power line, and the voltage of the fourth power line is greater than the voltage of the second power line.

12. The ESD protection circuit of claim 1, further comprising:

an ESD detection circuit, coupled with the plurality of ESD clamping circuits, and coupled between the first power line and the second power line, configured to compare a voltage of the first power line with a voltage threshold value, wherein if the voltage of the first power line is greater than the voltage threshold value, the ESD detection circuit controls the shunt circuit to conduct the first terminal of the first transistor to the control terminal of the first transistor, and controls the plurality of ESD clamping circuits to conduct a corresponding one of the plurality of transistors coupled with the second power line, and if the voltage of the first power line is lower than or equal to the voltage threshold value, the ESD detection circuit controls the shunt circuit to insulate the first terminal of the first transistor from the control terminal of the first transistor, and controls the plurality of ESD clamping circuits to switch off the corresponding one of the plurality of transistors coupled with the second power line.

13. The ESD protection circuit of claim 12, wherein the ESD detection circuit comprises:

an inverter, wherein an output terminal of the inverter of the ESD detection circuit is coupled with the shunt circuit, and coupled with a corresponding one of the plurality of ESD clamping circuits, wherein the corresponding one of the plurality of ESD clamping circuits comprises the corresponding one of the plurality of transistors coupled with the second power line; and a third bias circuit, coupled between the first power line and the second power line, configured to divide a voltage between the first power line and the second power line to set a voltage of an input terminal of the inverter of the ESD detection circuit.

14. The ESD protection circuit of claim 13, wherein the corresponding one of the plurality of ESD clamping circuits further comprises an inverter, an input terminal of the inverter of the corresponding one of the plurality of ESD clamping circuits is coupled with the output terminal of the inverter of the ESD detection circuit, and an output terminal of the inverter of the corresponding one of the plurality of ESD clamping circuits is coupled with a control terminal of the corresponding one of the plurality of transistors coupled with the second power line.

15. The ESD protection circuit of claim 13, wherein the third bias circuit comprises a plurality of diodes coupled in series, a plurality of resistors coupled in series or a plurality of diode-connected transistors coupled in series.

16. The ESD protection circuit of claim 1, wherein the plurality of transistors comprise a P-type transistor and a plurality of N-type transistors.

17. The ESD protection circuit of claim 1, wherein the plurality of transistors are all N-type transistors.

* * * * *